United States Patent
You

(10) Patent No.: US 10,535,722 B2
(45) Date of Patent: Jan. 14, 2020

(54) ORGANIC LIGHT-EMITTING DISPLAY APPARATUS HAVING A PIXEL ELECTRODE AND PIXEL-DEFINING FILM AND METHOD OF MANUFACTURING THE SAME

(71) Applicant: SAMSUNG DISPLAY CO., LTD, Yongin, Gyeonggi-Do (KR)

(72) Inventor: Chungi You, Yongin-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 288 days.

(21) Appl. No.: 14/977,317

(22) Filed: Dec. 21, 2015

(65) Prior Publication Data

US 2016/0307976 A1  Oct. 20, 2016

(30) Foreign Application Priority Data

Apr. 20, 2015 (KR) ........................ 10-2015-0055344

(51) Int. Cl.
| | |
|---|---|
| H01L 27/32 | (2006.01) |
| H01L 51/56 | (2006.01) |
| H01L 27/12 | (2006.01) |
| H01L 29/24 | (2006.01) |
| H01L 51/52 | (2006.01) |

(52) U.S. Cl.
CPC ........ H01L 27/3246 (2013.01); H01L 27/124 (2013.01); H01L 27/1225 (2013.01); H01L 27/1248 (2013.01); H01L 27/322 (2013.01); H01L 27/3248 (2013.01); H01L 27/3258 (2013.01); H01L 27/3276 (2013.01); H01L 27/3297 (2013.01); H01L 29/24 (2013.01); H01L 51/56 (2013.01); H01L 51/5215 (2013.01)

(58) Field of Classification Search
CPC . H01L 27/3248; H01L 29/66742–6678; H01L 29/786–78696; H01L 27/3276–3279; H01L 27/3258; H01L 27/322; H01L 27/3246

See application file for complete search history.

(56) References Cited

U.S. PATENT DOCUMENTS

| | | |
|---|---|---|
| 8,530,268 B2 | 9/2013 | Kim et al. |
| 2004/0207570 A1 | 10/2004 | Nishikawa et al. |

(Continued)

FOREIGN PATENT DOCUMENTS

| | | |
|---|---|---|
| JP | 2004-227853 A | 8/2004 |
| JP | 2006-73642 A | 3/2006 |

(Continued)

*Primary Examiner* — Kevin Parendo
(74) *Attorney, Agent, or Firm* — H.C. Park & Associates, PLC

(57) ABSTRACT

A method of manufacturing an organic light-emitting display apparatus includes forming a semiconductor layer on a substrate; forming a gate electrode on the semiconductor layer; forming an interlayer insulating film on an entire surface of the substrate to cover the gate electrode; forming a source electrode and a drain electrode on the interlayer insulating film; and forming a pixel electrode and a pixel-defining film on the source electrode and the drain electrode, wherein the forming of the pixel electrode and the pixel-defining film includes forming the pixel electrode and the pixel-defining film by using one mask.

6 Claims, 9 Drawing Sheets

(56) References Cited

U.S. PATENT DOCUMENTS

| | | | |
|---|---|---|---|
| 2010/0045173 A1* | 2/2010 | Kwon | H01L 27/3246 |
| | | | 313/504 |
| 2011/0085325 A1 | 4/2011 | Lecloux et al. | |
| 2012/0049169 A1* | 3/2012 | Kim | H01L 27/3246 |
| | | | 257/40 |
| 2012/0104396 A1* | 5/2012 | Pyo | H01L 27/124 |
| | | | 257/59 |
| 2013/0015459 A1 | 1/2013 | Lee et al. | |
| 2014/0028181 A1* | 1/2014 | Lee | H05B 33/14 |
| | | | 313/504 |
| 2016/0155786 A1* | 6/2016 | Park | H01L 27/3246 |
| | | | 257/40 |

FOREIGN PATENT DOCUMENTS

| | | |
|---|---|---|
| KR | 10-2013-0009137 A | 1/2013 |
| KR | 10-2014-0090722 A | 7/2014 |

* cited by examiner

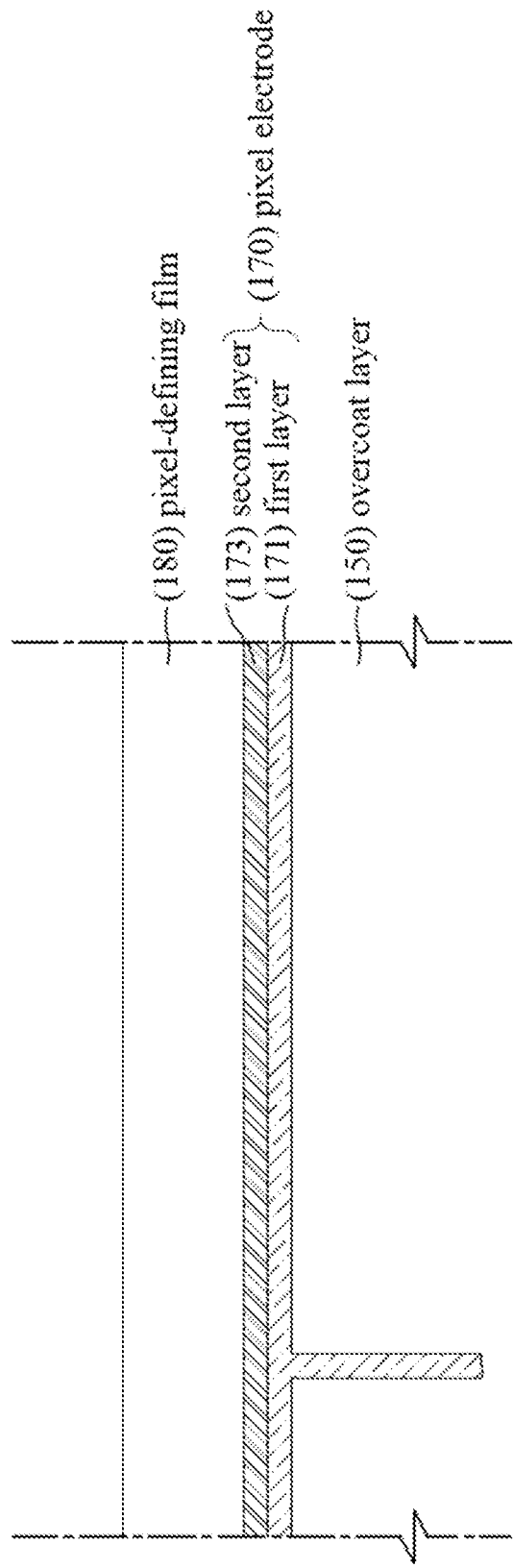

US 10,535,722 B2

ORGANIC LIGHT-EMITTING DISPLAY APPARATUS HAVING A PIXEL ELECTRODE AND PIXEL-DEFINING FILM AND METHOD OF MANUFACTURING THE SAME

CLAIM OF PRIORITY

This application claims the priority of and all the benefits accruing under 35 U.S.C. § 119 of Korean Patent Application No. 10-2015-0055344, filed on Apr. 20, 2015, in the Korean Intellectual Property Office (KIPO), the disclosure of which is incorporated herein in its entirety by reference.

BACKGROUND OF THE INVENTION

1. Field of Disclosure

One or more exemplary embodiments relate to an organic light-emitting display apparatus and a method of manufacturing the same.

2. Description of the Related Art

Flat panel display apparatuses such as a plasma display panel (PDP), a liquid crystal display (LCD) apparatus, and an organic electroluminescent display apparatus have been spotlighted.

An LCD apparatus is not self-emissive, and thus suffers from a low brightness, a low contrast ratio, a narrow viewing angle, and a large overall size. Although a PDP is a self-emissive device, the PDP has a greater weight, higher power consumption, and a more complex manufacturing method than other flat panel display apparatuses.

However, an organic electroluminescent display apparatus is self-emissive, and thus has a wide viewing angle and a high contrast ratio. Also, the organic electroluminescent display apparatus does not need a backlight, and thus has a light and thin design and low power consumption. Also, the organic electroluminescent display apparatus may operate with a low direct current (DC) voltage and may have a fast response time. The organic electroluminescent display apparatus is solid, and thus may sufficiently withstand external impact and may have a wide operational temperature range. The organic electroluminescent display apparatus may be simply manufactured at low costs.

One unit pixel for displaying natural color in an organic electroluminescent display apparatus includes red (R), green (G), and blue (B) sub-pixels, and the sub-pixels may include an organic emission layer that emits white light.

SUMMARY OF THE INVENTION

One or more exemplary embodiments include an organic light-emitting display apparatus and a method of manufacturing the same.

Additional aspects will be set forth in part in the description which follows and, in part, will be apparent from the description, or may be learned by practice of the presented embodiments.

According to one or more exemplary embodiments, a method of manufacturing an organic light-emitting display apparatus includes forming a semiconductor layer on a substrate; forming a gate electrode on the semiconductor layer; forming an interlayer insulating film on an entire surface of the substrate to cover the gate electrode; forming a source electrode and a drain electrode on the interlayer insulating film; and forming a pixel electrode and a pixel-defining film on the source electrode and the drain electrode, wherein the forming of the pixel electrode and the pixel-defining film includes forming the pixel electrode and the pixel-defining film by using one mask.

The pixel electrode may include a first layer and a second layer.

The first layer may be disposed under the second layer, wherein the first layer includes titanium (Ti) or a Ti alloy.

The first layer may be disposed under the second layer, wherein the second layer includes a conductive oxide.

The first layer may be formed to have a thickness that is equal to or less than 300 Å.

After the forming of the source electrode and the drain electrode, the method may further include forming red, green, and blue color filters on the interlayer insulating film.

After the forming of the red, green, and blue color filters and before the forming of the pixel electrode and the pixel-defining film, the method may further include forming an overcoat layer on the red, green, and blue color filters.

The semiconductor layer may include an oxide.

The forming of the pixel electrode and the pixel-defining film may include forming the pixel electrode and the pixel-defining film on the entire surface of the substrate; patterning the pixel-defining film by using a half-tone mask; etching part of the second layer by using the patterned pixel-defining film as a mask; ashing the pixel-defining film; and etching part of the first layer by using the second layer as a mask.

After the forming of the pixel electrode and the pixel-defining film, the method may further include forming an intermediate layer and a counter electrode.

According to one or more exemplary embodiments, a method of manufacturing an organic light-emitting display apparatus includes forming a semiconductor layer on a substrate; forming a gate electrode on the semiconductor layer; forming an interlayer insulating film on an entire surface of the substrate to cover the gate electrode; forming a source electrode and a drain electrode on the interlayer insulating film; forming a pixel electrode including a first layer and a second layer on the source electrode and the drain electrode; forming a pixel-defining film on the pixel electrode; patterning the pixel-defining film by using a half-tone mask; etching part of the second layer by using the patterned pixel-defining film as a mask; ashing the pixel-defining film; and etching part of the first layer by using the second layer as a mask.

The first layer may be disposed under the second layer, wherein the first layer includes titanium (Ti) or a Ti alloy.

The first layer may be disposed under the second layer, wherein the second layer includes a conductive oxide.

The first layer may be formed to have a thickness that is equal to or greater than 300 Å.

After the forming of the source electrode and the drain electrode, the method may further include forming red, green, and blue color filters on the interlayer insulating film.

After the forming of the red, green, and blue color filters and before the forming of the pixel electrode and the pixel-defining film, the method may further include forming an overcoat layer on the red, green, and blue color filters.

The semiconductor layer may include an oxide.

According to one or more exemplary embodiments, an organic light-emitting display apparatus includes a substrate; a semiconductor layer that is formed on the substrate; a gate electrode that is formed on the semiconductor layer; an interlayer insulating film that is formed on an entire surface of the substrate to cover the gate electrode; a source electrode and a drain electrode that are formed on the interlayer insulating film; a pixel electrode that is formed on the source electrode and the drain electrode; and a pixel-defining film that is formed on the pixel electrode and defines a pixel region and a non-pixel region, wherein the pixel electrode and the pixel-defining film are formed by using one mask.

The pixel electrode may include a first layer and a second layer.

The first layer may be formed under the second layer, wherein the first layer includes titanium (Ti) or a Ti alloy.

The first layer may be formed under the second layer, wherein the second layer includes a conductive oxide.

The first layer may be formed to have a thickness that is equal to or less than 300 Å.

The organic light-emitting display apparatus may further include red, green, and blue color filters that are formed on the interlayer insulating film.

The organic light-emitting display apparatus may further include an overcoat layer that is formed on the red, green, and blue color filters.

The semiconductor layer may include an oxide.

According to one or more exemplary embodiments, an organic light-emitting display apparatus includes a substrate; a semiconductor layer that is formed on the substrate; a gate electrode that is formed on the semiconductor layer; an interlayer insulating film that is formed on an entire surface of the substrate to cover the gate electrode; a source electrode and a drain electrode that are formed on the interlayer insulating film; a pixel electrode that is formed on the source electrode and the drain electrode and includes a first layer and a second layer; and a pixel-defining film that is formed on the pixel electrode and defines a pixel region and a non-pixel region, wherein the pixel electrode and the pixel-defining film are formed by using one mask, wherein the first layer includes a metal and the second layer includes a conductive oxide.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 2A through 2E are cross-sectional views for explaining operations of forming a pixel electrode and a pixel-defining film in a method of manufacturing an organic light-emitting display apparatus, according to an exemplary embodiment;

DETAILED DESCRIPTION OF THE INVENTION

Figure 1:
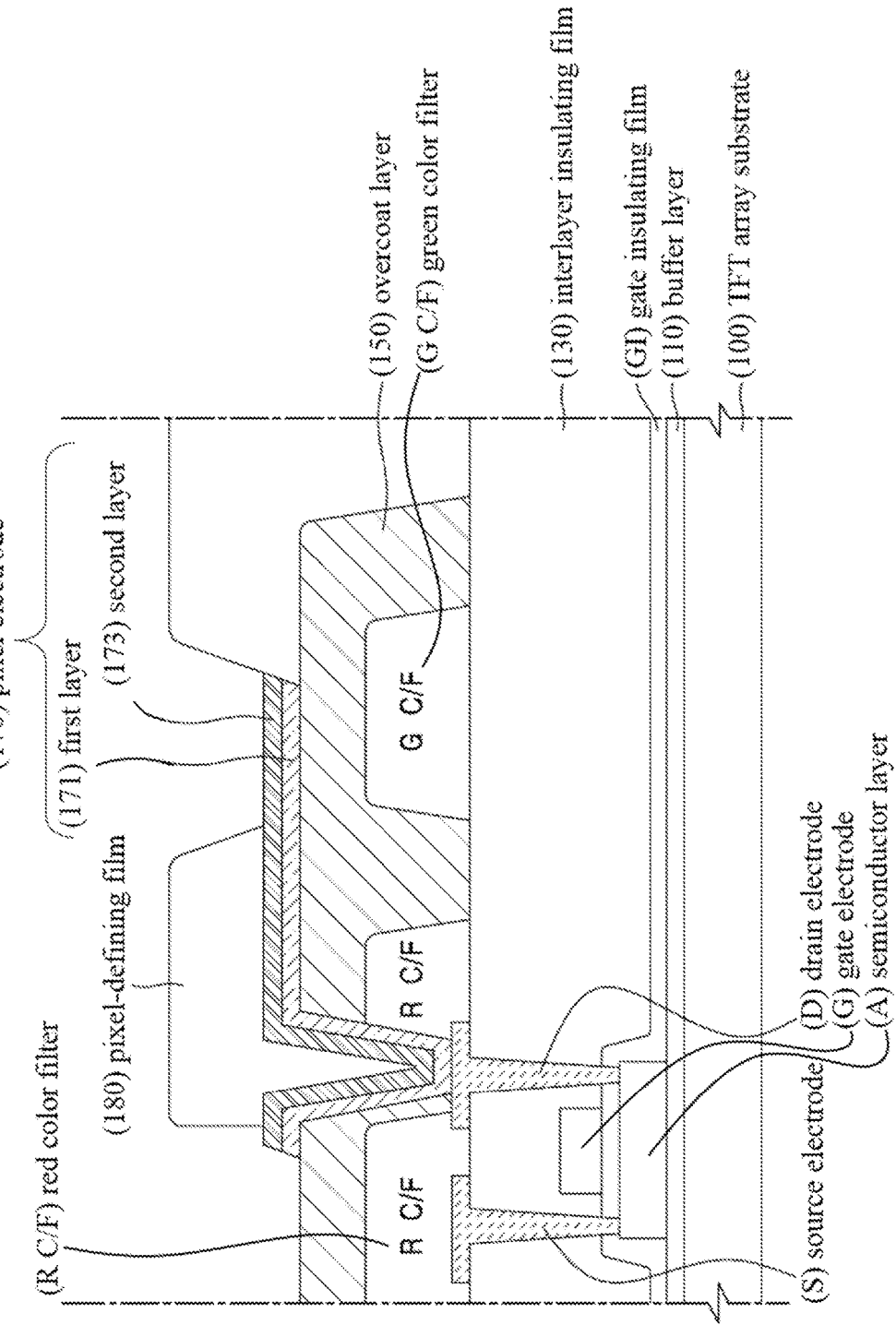
FIG. 1 is a cross-sectional view of a thin-film transistor (TFT) array substrate included in an organic light-emitting display apparatus that is formed by using a method of manufacturing an organic light-emitting display apparatus according to an exemplary embodiment.

The inventive concept may include various embodiments and modifications, and exemplary embodiments thereof will be illustrated in the drawings and will be described herein in detail. The effects and features of the inventive concept and the accompanying methods thereof will become apparent from the following description of the embodiments, taken in conjunction with the accompanying drawings. However, the inventive concept is not limited to the embodiments described below, and may be embodied in various modes.

Reference will now be made in detail to embodiments, examples of which are illustrated n the accompanying drawings. In the drawings, the same elements are denoted by the same reference numerals, and thus a repeated explanation thereof will not be given.

While such terms as "first", "second", etc., may be used to describe various components, such components must not be limited to the above terms. The above terms are used only to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a component, such as a film, a region, or an element, is referred to as being "on" another component, the component can be directly on the other component or intervening components may be present therebetween.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of" when preceding a list of elements, modify the entire list of elements and do not modify the individual elements of the list.

FIG. 1 is a cross-sectional view of a thin-film transistor (TFT) array substrate 100 included in an organic light-emitting display apparatus that is formed by using a method of manufacturing an organic light-emitting display apparatus, according to an exemplary embodiment.

The organic light-emitting display apparatus according to an exemplary embodiment may be a white organic light-emitting display apparatus including an organic emission layer that emits white light.

In detail, the organic light-emitting display apparatus may be a bottom emission white organic light-emitting display apparatus including color filters as shown in FIG. 1.

The method of manufacturing an organic light-emitting display apparatus, according to the present exemplary embodiment, may include forming a buffer layer 110 on the TFT array substrate 100. The buffer layer 110 may prevent diffusion of impurity ions or penetration of moisture or external air into TFT, OLED and may function as a barrier layer and/or a blocking layer for planarizing a surface of the TFT array substrate 100. The buffer layer 110 is not an essential element and may be omitted.

First, a semiconductor layer A may be formed on the buffer layer 110. According to an exemplary embodiment, the semiconductor layer A may be formed by using photolithography and etching.

The semiconductor layer A may be formed of a transparent conductive oxide. The transparent conductive oxide may include at least one chemical element selected from gallium (Ga), indium (In), zinc (Zn), hafnium (Hf), and tin (Sn). For example, the transparent conductive oxide may be selected from InGaZnO, ZnSnO, InZnO, InGaO, ZnO, TiO, and hafnium-indium-zinc oxide (HIZO).

Since a TFT including a silicon oxide layer has to be formed by using a high-temperature process and has to undergo a crystallization process, as a size of the TFT increases, uniformity may be reduced during the crystallization process, thereby making it difficult to increase the size of the TFT.

However, since an oxide semiconductor TFT including a transparent conductive oxide as an active layer has excellent device characteristics and may be formed by using a low-temperature process, it is stated that the oxide semiconductor TFT may be used for a backplane of a flat panel display apparatus. Also, since the oxide semiconductor TFT is transparent in a visible region and is flexible, the oxide semiconductor TFT may be applied to a transparent display apparatus or a flexible display apparatus.

After the semiconductor layer A is formed, a gate insulating film GI may be formed on the semiconductor layer A to correspond to an entire surface of the TFT array substrate 100. The gate insulating film GI may be formed to have a multi-layer or single-layer structure formed of an inorganic material such as silicon oxide or silicon nitride. The gate insulating film GI may insulate the semiconductor layer A from a gate electrode G that is disposed over the semiconductor layer A.

After the gate insulating film GI is formed, the gate electrode G may be formed on the gate insulating film GI. According to an exemplary embodiment, the gate electrode G may be formed by using photolithography and etching.

The gate electrode G may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

After the gate electrode G is formed on the gate insulating film GI, an interlayer insulating film 130 may be formed on the entire surface of the TFT array substrate 100.

The interlayer insulating film 130 may be formed of an inorganic material or an organic material. In some exemplary embodiments, the interlayer insulating film 130 may be formed of an organic material. For example, the interlayer insulating film 130 may be formed of at least one material selected from an acryl-based resin (e.g., a polyacrylate resin), an epoxy resin, a phenolic resin, a polyamide-based resin, a polyimide-based resin, an unsaturated polyester-based resin, a polyphenylene ether-based resin, a polyphenylenesulfide-based resin), and benzocyclobutene (BCB).

After the interlayer insulating film 130 is formed on the TFT array substrate 100, a contact hole may be formed in the interlayer insulating film 130 and a source electrode S and a drain electrode D may be formed on the interlayer insulating film 130. According to an exemplary embodiment, the source electrode S and the drain electrode D may be formed by using photolithography and etching.

The source electrode S and the drain electrode D may be connected to the semiconductor layer A through the contact hole that is formed in the interlayer insulating film 130.

The organic light-emitting display apparatus according to the present exemplary embodiment is a bottom emission white organic light-emitting display apparatus, as shown in FIG. 1.

In the TFT array substrate 100 formed by using the method of manufacturing an organic light-emitting display apparatus, according to the present exemplary embodiment, after the source electrode S and the drain electrode D are formed, color filters C/F may be formed on the interlayer insulating film 130.

The color filters C/F may include a red color filter R C/F, a green color filter G C/F, and a blue color filter B C/F (not shown). The red color filter R C/F may be formed on the interlayer insulating film 130 in a red sub-pixel region to emit red light, the green color filter G C/F may be formed on the interlayer insulating film 130 in a green sub-pixel region to emit green light, and the blue color filter B C/F may be formed on the interlayer insulating film 130 in a blue sub-pixel region to emit blue light.

That is, after the interlayer insulting film 130 is formed on the TFT array substrate 100, the red, green, and blue color filters R, G, and B C/F may be formed over the TFT array substrate 100 including the source electrode S and the drain electrode D to respectively correspond to the red, green, and blue sub-pixel regions.

In detail, after a red color resist is coated, the red color filter R C/F may be formed on the interlayer insulating film 130 in the red sub-pixel region by using photolithography and etching.

Next, after a green color resist is coated, the green color filter G C/F may be formed on the interlayer insulating film 130 in the green sub-pixel region by using photolithography and etching.

Next, after a blue color resist is coated, the blue color filter B C/F (not shown) may be formed on the interlayer insulating film 130 in the blue sub-pixel region by using photolithography and etching.

Accordingly, the red, green, and blue color filters R, G, and B C/F may be respectively formed in the red, green, and blue pixel regions.

After the red, green, and blue color filters C/F are formed, an overcoat layer 150 may be formed on the color filters C/F. According to an exemplary embodiment, the overcoat layer 150 may be formed by using photolithography and etching.

The overcoat layer 150 may be formed on the color filters C/F to protect the color filters C/F, and may be formed of an organic material such as an acryl-based resin.

The overcoat layer 150 may be formed of an inorganic material or an organic material. In some exemplary embodiments, the overcoat layer 150 may be formed of an organic material. For example, the overcoat layer 150 may be formed of at least one material selected from a polyacrylate-based resin, an epoxy resin, a phenolic resin, a polyamide-based resin, a polyimide-based resin, an unsaturated polyester-based resin, a polyphenylene ether-based resin, a polyphenylenesulfide-based resin), and BCB.

The overcoat layer 150 is not an essential element. However, the overcoat layer 150 may protect the color filters C/F and may function as a via layer.

After the overcoat layer 150 is formed on the interlayer insulating film 130, a pixel electrode 170 and a pixel-defining film 180 may be formed on the overcoat layer 150.

In particular, the method of manufacturing an organic light-emitting display apparatus, according to the present exemplary embodiment, may include forming the pixel electrode 170 and the pixel-defining film 180 by using one mask, instead of different masks.

Since the method of manufacturing an organic light-emitting display apparatus, according to the present exemplary embodiment, involves forming the pixel electrode 170 and the pixel-defining film 180 by using one mask, unlike a conventional method in which the pixel electrode 170 and the pixel-defining film 180 are sequentially formed by using different masks, a time and cost may be reduced, thereby increasing competitiveness.

A method of forming the pixel electrode 170 and the pixel-defining film 180 by using one mask in the method of manufacturing an organic light-emitting display, apparatus according to the present exemplary embodiment, will be explained below in detail.

The pixel electrode 170 of the organic light-emitting display apparatus manufactured by using the method of manufacturing an organic light-emitting display apparatus, according to the present exemplary embodiment, may include a first layer 171 and a second layer 173.

The first layer 171 may be formed under the second layer 173, as shown in FIGS. 1 and 2A.

The first layer 171 may be formed of a metal, and may prevent the overcoat layer 150 from being etched during a subsequent process for ashing the pixel-defining film 180.

According to an exemplary embodiment, the first layer 171 may be formed of titanium (Ti) or a Ti alloy. However, the present exemplary embodiment is not limited thereto, and the first layer 171 may be formed of any other materials. Since the first layer 171 is formed of a metal material to function as a barrier for preventing the overcoat layer 150 that is disposed under the first layer 171 from being etched, the first layer 171 may be formed to have a small thickness.

Although a thickness of the first layer 171 is not limited, the first layer 171 may be formed to have a thickness that is equal to or less than 300 Å in order to meet a demand for a thin design.

The second layer 173 may be formed of a transparent conductive oxide. That is, the second layer 173 may include at least one selected from indium tin oxide (ITO), indium zinc oxide (IZO), zinc oxide (ZnO), indium oxide (In2O3), indium gallium oxide (IGO), and aluminum zinc oxide (AZO).

FIGS. 2A through 2E are cross-sectional views for explaining operations of forming the pixel electrode 170 and the pixel-defining film 180 in a method of manufacturing an organic light-emitting display apparatus, according to an exemplary embodiment. In FIGS. 2A through 2E, the same elements as those in FIG. 1 are denoted by the same reference numerals, and thus a repeated explanation thereof will not be given.

As described above in FIG. 2A, after the overcoat layer 150 is formed on the interlayer insulating film 130, the pixel electrode 170 may be formed on the overcoat layer 150 to correspond to the entire surface of the TFT array substrate 100 and the pixel-defining film 180 may be formed on the pixel electrode 170 to correspond to the entire surface of the TFT array substrate 100.

Figure 2B:
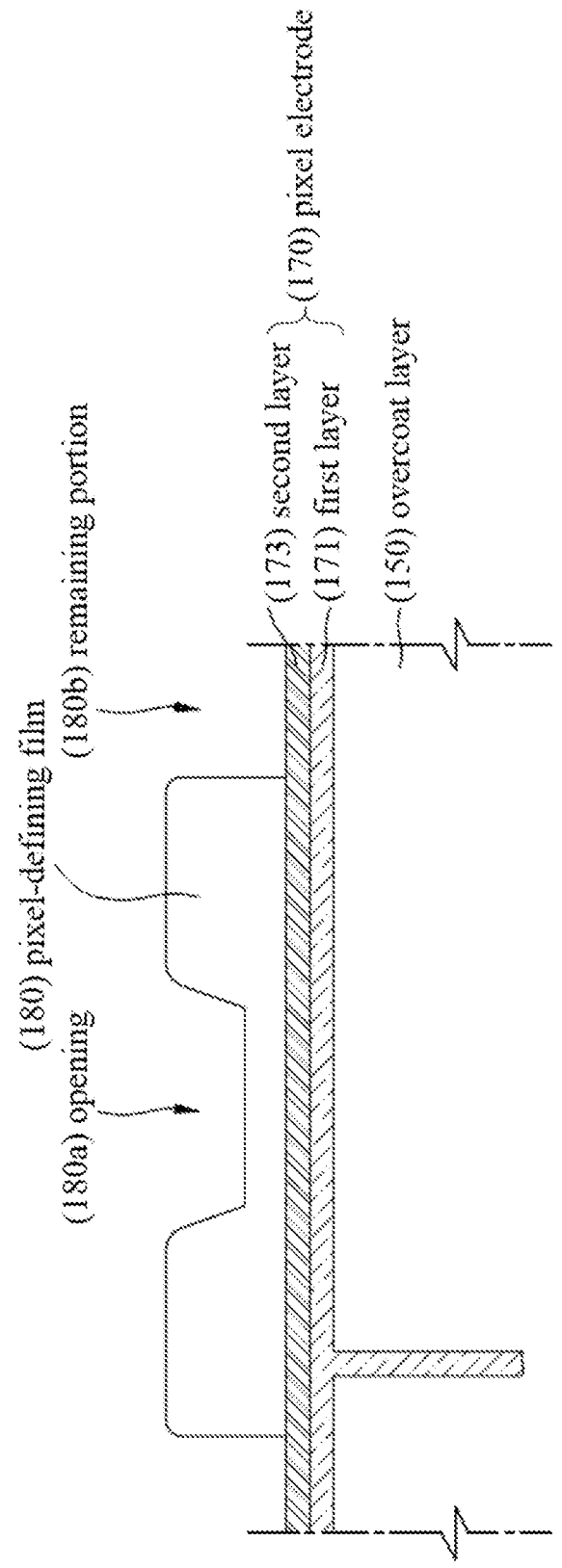

Next, referring to FIG. 2B, the pixel-defining film 180 may be patterned by using a half-tone mask.

As the pixel-defining film 180 is patterned by using the half-tone mask, a portion of the pixel-defining film 180 corresponding to an opening 180a that is to be a pixel region may be partially removed and a portion of the pixel-defining film 180 corresponding to a remaining portion 180b that is to be a non-pixel region may be completely removed, as shown in FIG. 2B.

Figure 2C:
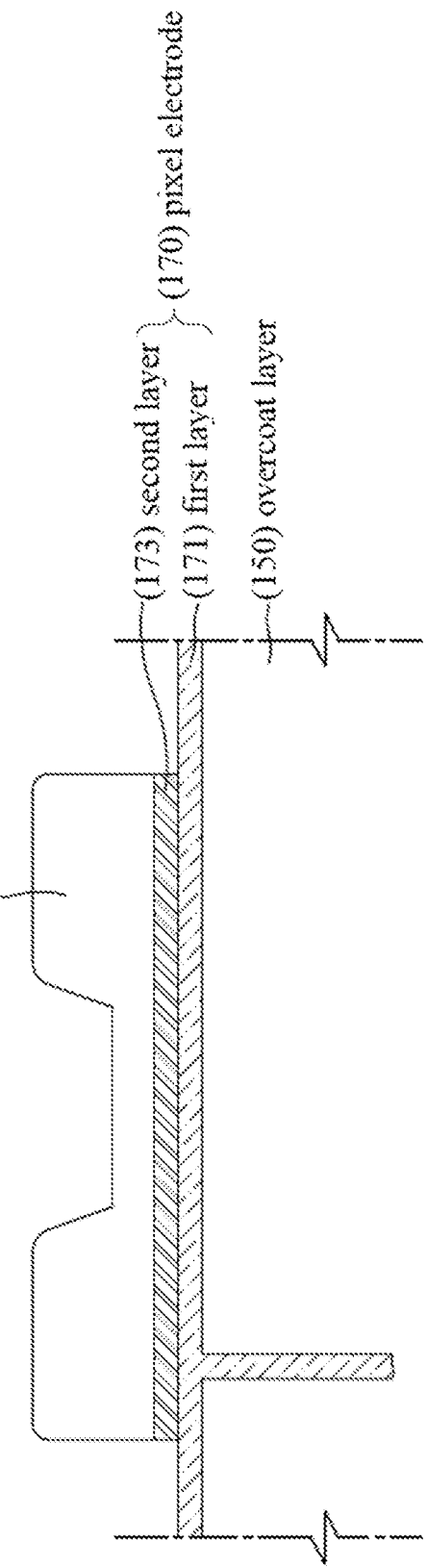

Referring to FIG. 2C, after the pixel-defining film 180 is patterned, the exposed second layer 173 may be removed by using etching. That is, a portion of the second layer 173 other than a portion on which the pixel-defining film 180 is formed may be etched by using the patterned pixel-defining film 180 as a mask. According to an exemplary embodiment, the exposed second layer 173 may be etched by using, but not limited to, dry etching.

Figure 2D:
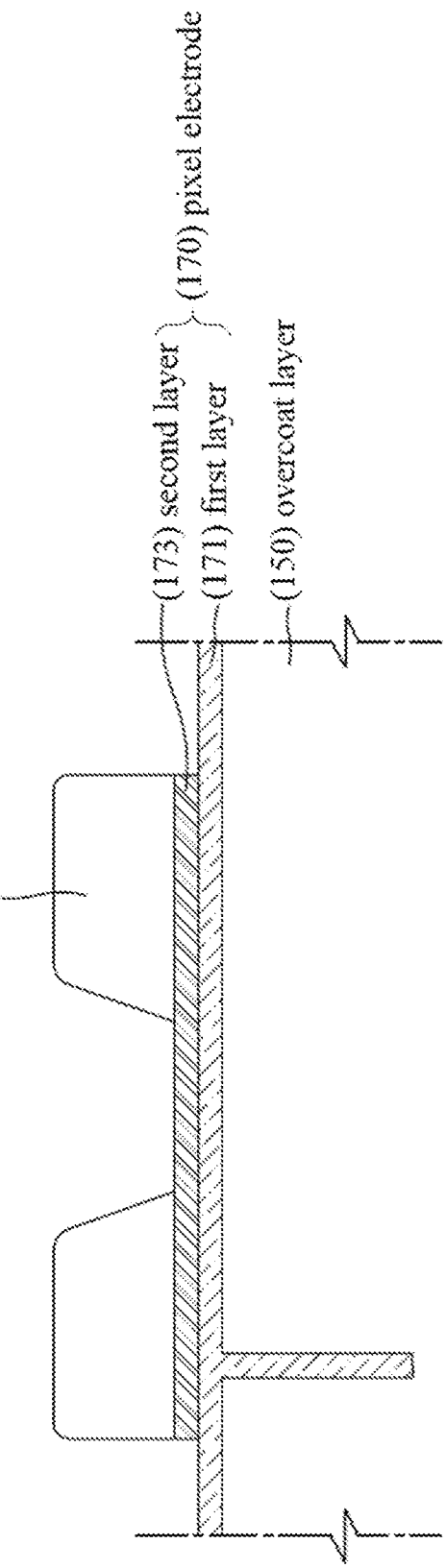

Next, referring to FIG. 2D, after the exposed second layer 173 is etched, the pixel-defining film 180 may be ashed. The ashing that is a process of destroying or decomposing organic substances may be performed by using various methods.

The method of manufacturing an organic light-emitting display apparatus, according to the present exemplary embodiment, is not limited to a method of ashing the pixel-defining film 180. Accordingly, a part of the pixel-defining film 180 that remains in the opening 180a that is to be the pixel region may be removed by using ashing, as shown in FIG. 2D.

When the overcoat layer 150 that is disposed under the pixel electrode 170 is formed of an organic material, the overcoat layer 150 may be damaged by the ashing. However, in the method of manufacturing an organic light-emitting display apparatus, according to the present exemplary embodiment, since the pixel electrode 170 includes the first layer 171, the overcoat layer 150 may be prevented from being damaged.

That is, as described above, since the first layer 171 is formed of a metal material and functions as a barrier, only the pixel-defining film 180 may be removed during the ashing without damaging the overcoat layer 150.

Figure 2E:
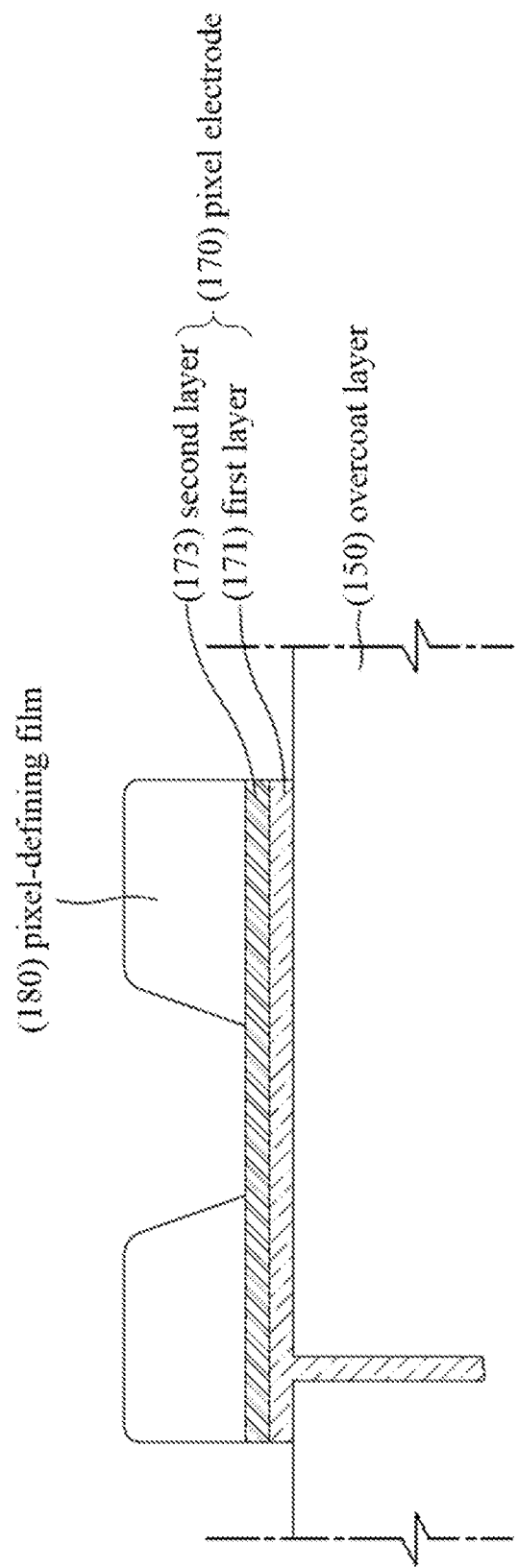

Referring to FIG. 2E, after the pixel-defining film 180 is ashed, part of the first layer 171 may be removed. In this case, a portion of the first layer 171 other than a portion on which the second layer 173 remains may be removed by using the second layer 173 as a mask. According to an exemplary embodiment, part of the first layer 171 may be etched by using, but not limited to, dry etching.

As described above, in the method of manufacturing an organic light-emitting display apparatus, according to the present exemplary embodiment, the pixel electrode 170, including the first layer 171 and the second layer 173, and the pixel-defining film 180 may be formed by using only one half-tone mask. Accordingly, a time and cost may be reduced, thereby making it possible to manufacture an organic light-emitting display apparatus having high competitiveness.

An intermediate layer 193, a counter electrode 195, and spacers 200 that are to be formed on the pixel electrode 170 and the pixel-defining film 180 will be explained below.

Figure 3:
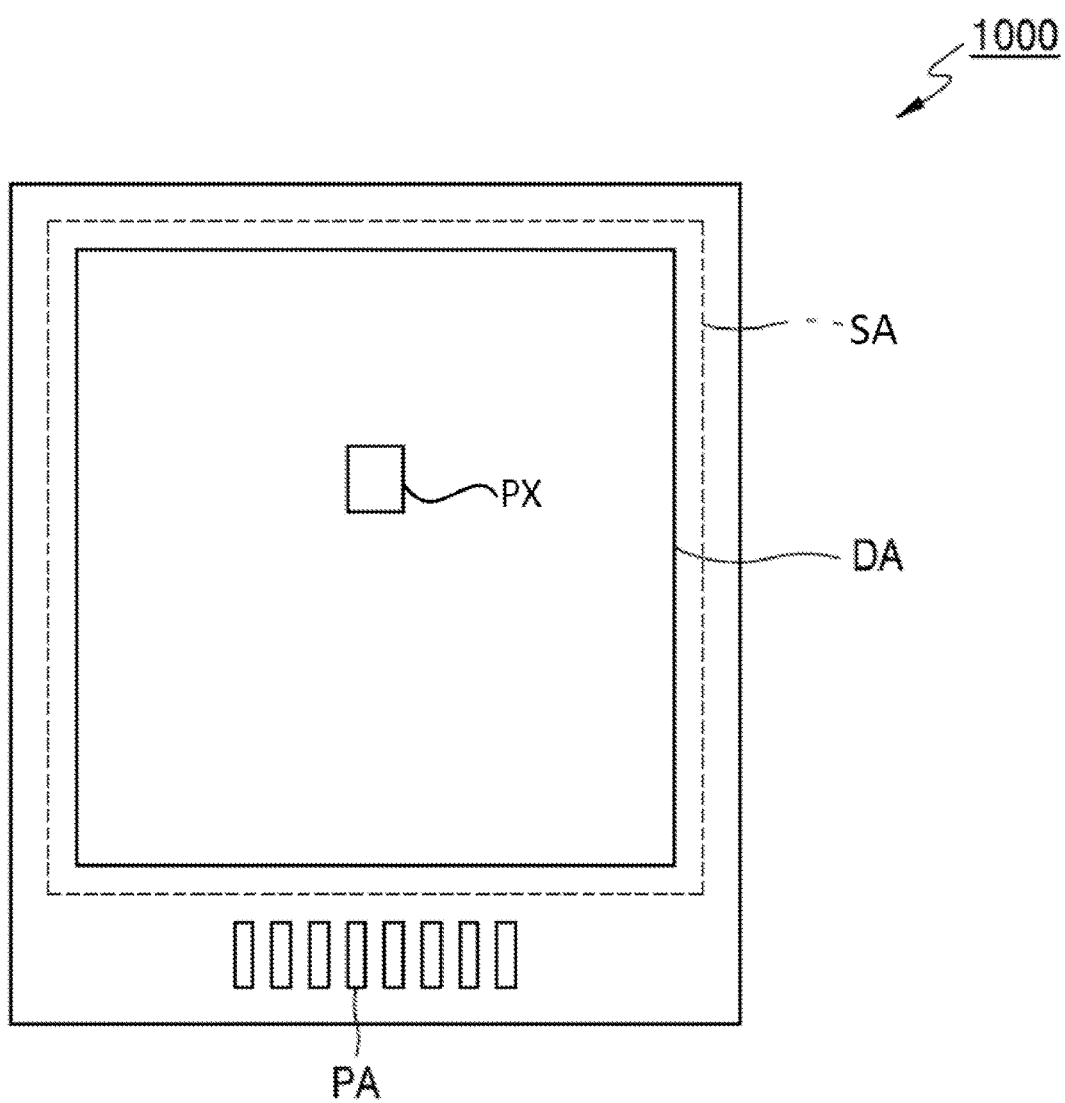
FIG. 3 is a plan view of an organic light-emitting display apparatus manufactured by using the method of manufacturing an organic light-emitting display apparatus, according to an exemplary embodiment.
Figure 4:
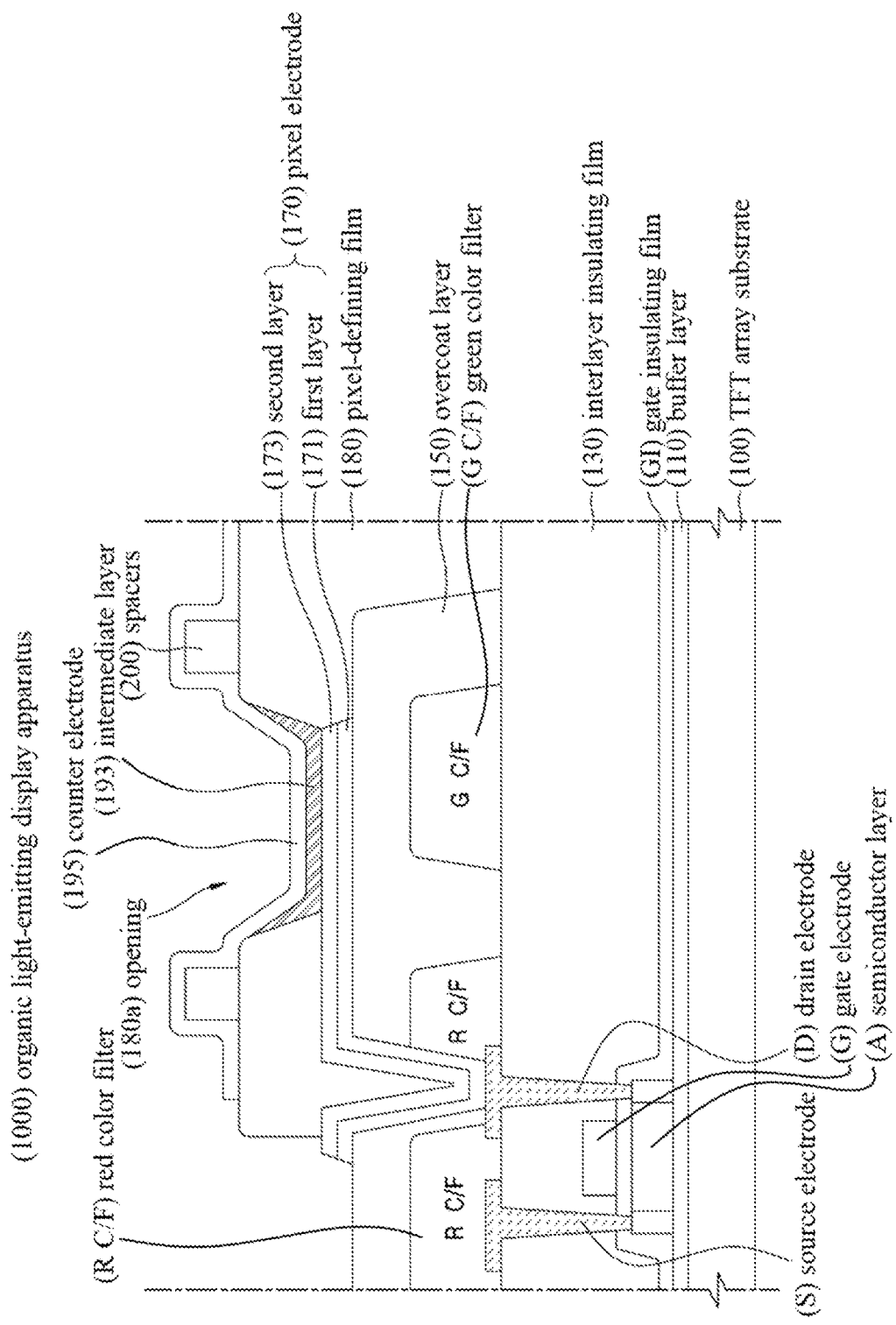
FIG. 4 is a cross-sectional view of the display area of the organic light-emitting display apparatus of FIG. 3.

FIG. 3 is a plan view of an organic light-emitting display apparatus 1000 manufactured by using the method of manufacturing an organic light-emitting display, apparatus according to the present exemplary embodiment. FIG. 4 is a cross-sectional view of the organic light-emitting display apparatus 1000 of FIG. 3. In FIGS. 3 and 4, the same elements as those in FIGS. 1 through 2E are denoted by the same reference numerals, and thus a repeated explanation thereof will not be given.

The organic light-emitting display apparatus 1000 may be divided into a display area DA where an image is displayed and a non-display area around the display area DA. The non-display area includes a sealing area SA and a pad area PA.

A sealing substrate (not shown) and/or a sealing material (not shown) may be disposed in the sealing area SA to surround the display area DA, and is not limited as long as the sealing substrate and/or the sealing material may seal the display area DA.

The sealing substrate may be a thin-film encapsulation substrate, and in this case, the sealing material may be omitted. The sealing substrate may prevent external air or moisture from penetrating into a plurality of TFTs and an organic light-emitting device (OLED) that are disposed on the TFT array substrate 100. Accordingly, a polarization film or a color filter may be further provided on the sealing substrate as desired.

The sealing material may be an inorganic material such as a frit. However, the present exemplary embodiment is not limited thereto, and the sealing material may be epoxy. The sealing material may be coated by using a dispenser or screen printing. The frit generally refers to a raw material in a powder state used to form a glass, but may encompass a material in a paste state obtained by adding a laser or infrared absorber, an organic binder, or a filler for reducing a thermal expansion coefficient to a main material such as $SiO_2$. The frit in the paste state may be cured as the organic binder and moisture are removed during drying or firing. The laser or infrared absorber may include a transition metal compound. A laser beam may be used as a heat source for curing the sealing material and attaching the TFT array substrate 100 to the sealing substrate. A light-absorbing layer (not shown) for helping to absorb the laser beam during the curing using the laser beam may be further disposed under the sealing material. The light-absorbing layer may be formed of a conductive material having a high heat transfer coefficient.

The pad area PA refers to an area where various members for driving pixels provided in the display area DA and other modules are mounted.

The OLED is provided on the TFT array substrate 100 in the display area DA of the organic light-emitting display apparatus 100 as shown in FIG. 4. The OLED includes the pixel electrode, the intermediate layer 193 including an organic emission layer, and the counter electrode 195. Also, the organic light-emitting display apparatus 1000 may further include the pixel-defining film 180 and the spacers 200.

The organic light-emitting display apparatus 1000 according to an exemplary embodiment may be manufactured by using the method of manufacturing an organic light-emitting display apparatus, according to an exemplary embodiment. That is, the pixel electrode 170 and the pixel-defining film 180 of the organic light-emitting display apparatus 1000 according to the present exemplary embodiment may be formed by using one mask.

Since the pixel electrode 170 and the pixel-defining film 180, which are individually formed by using different masks in a conventional method, are formed by using only one mask in the present exemplary embodiment, competitiveness in a large display apparatus may be increased.

The pixel electrode 170 may be electrically connected to the source electrode S or the drain electrode D as shown in FIG. 4. The present exemplary embodiment is not limited thereto, and a contact metal (not shown) may be provided, the source electrode S or the drain electrode D may contact the contact metal, and the pixel electrode 170 may be electrically connected to the contact metal.

The counter electrode 195 may be a transparent electrode or a reflective electrode. When the counter electrode 195 is a transparent electrode, the counter electrode 195 may include ITO, IZO, ZnO, or $In_2O_3$. When the counter electrode 195 is a reflective electrode, the counter electrode 195 may include a reflective film formed of Ag, Mg, Al, Pt, Pd, Au, Ni, Nd, Ir, Cr, or a compound thereof and a transparent film formed of ITO, IZO, ZnO, or $In_2O_3$. In some exemplary embodiments, the counter electrode 195 may have a ITO/Ag/ITO structure.

The pixel-defining film 180 may define a pixel region and a non-pixel region. The pixel-defining film 180 may include the opening 180a through which the pixel electrode 170 is exposed, and may be formed to entirely cover the TFT array substrate 100. The intermediate layer 193 may be formed in the opening 180a, and the opening 180a may be substantially the pixel region.

The pixel electrode 170, the intermediate layer 193, and the counter electrode 195 constitute the OLED. Holes and electrons injected from the pixel electrode 170 and the counter electrode 195 of the OLED combine with each other in the organic emission layer of the intermediate layer 193 to generate light.

The intermediate layer 193 may include the organic emission layer. Alternatively, the intermediate layer 193 may include the organic emission layer, and may further include at least one of a hole injection layer (HIL), a hole transport layer (HTL), an electron transport layer (ETL), and an electron injection layer (EIL). The present exemplary embodiment is not limited thereto, and the intermediate layer 193 may include the organic emission layer, and may further include other various functional layers.

The counter electrode 195 is formed on the intermediate layer 193. The counter electrode 195 and the pixel electrode 170 may form an electric field and may help light to be emitted from the intermediate layer 193. The pixel electrode 170 may be patterned for each pixel, and the counter electrode 195 may be formed so that a common voltage is applied to all pixels.

The pixel electrode 170 may function as an anode and the counter electrode 195 may function as a cathode, but the present exemplary embodiment is not limited thereto. For example, the pixel electrode 170 may function as a cathode and the counter electrode 195 may function as an anode.

Although only one OLED is illustrated in FIG. 4, a display panel may include a plurality of the OLEDs. One pixel may be formed for each of the OLEDs, and each pixel may emit red, green, blue, or white light.

However, the present exemplary embodiment is not limited thereto. The intermediate layer 193 may be commonly formed over the pixel electrode 170 irrespective of a position of a pixel (e.g. PX in FIG. 3). In this case, the organic emission layer may be formed by vertically stacking or combining layers including light-emitting materials that emit, for example, red, green, and blue light. Other combinations may be made as long as they may emit white light. Also, a color conversion layer or a color filter for converting the emitted white light into predetermined color light may be further provided.

A protective layer (not shown) may be disposed on the counter electrode 195, and may cover and protect the OLED. The protective layer may be an inorganic insulating film and/or an organic insulating film.

The spacers 200 may be disposed between pixel regions in the display area DA. The spacers 200 may maintain an interval between the TFT array substrate 100 and the sealing substrate, and may prevent display characteristics from being deteriorated due to external impact.

The spacers 200 may be provided on the pixel-defining film 180. The spacers 200 may protrude from the pixel-defining film 180 toward the sealing substrate.

In some exemplary embodiments, the spacers 200 may be formed of the same material by using the same process as those of the pixel-defining film 180. That is, the pixel-defining film 180 and the spacers 200 may be simultaneously formed by adjusting the amount of light through an exposure process using a half-tone mask. However, the present exemplary embodiment is not limited thereto. The pixel-defining film 180 and the spacers 200 may be sequentially or individually formed, and thus may be independent structures formed by using different materials.

As described above, in the organic light-emitting display apparatus 1000 according to an exemplary embodiment, since the pixel electrode 170 and the pixel-defining film 180 are formed by using only one mask without performing different mask processes, a time and costs may be reduced, thereby increasing competitiveness in a large display apparatus.

Figure 5:
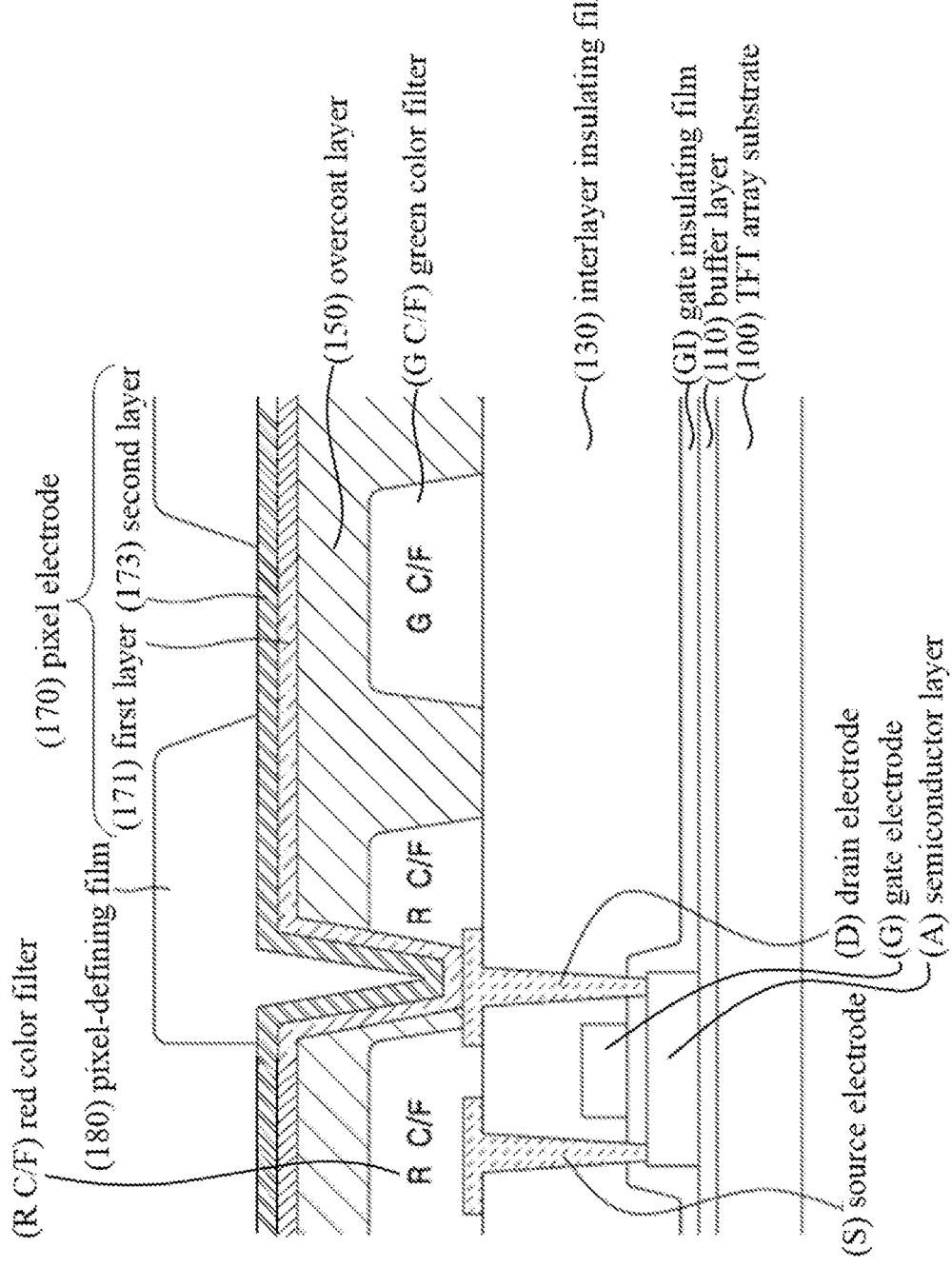
FIG. 5 is a cross-sectional view of another exemplary embodiment of the organic light-emitting apparatus.

FIG. 5 is a cross-sectional view of another exemplary embodiment of the organic light-emitting apparatus, showing an organic light-emitting display apparatus comprising a substrate; a semiconductor layer that is formed on the substrate; a gate electrode that is formed on the semiconductor layer; an interlayer insulating film that is formed on an entire surface of the substrate to cover the gate electrode; a source electrode and a drain electrode that are formed on the interlayer insulating film; a pixel electrode that is formed on the source electrode and the drain electrode; and a pixel-defining film that is formed on the pixel electrode and defines a pixel region and a non-pixel region, the pixel electrode and the pixel-defining film being formed by using one mask.

According to the one or more exemplary embodiments, since a pixel electrode and a pixel-defining film are formed by using only one mask, a time and costs may be reduced.

While the inventive concept has been particularly shown and described with reference to exemplary embodiments thereof, they are provided for the purposes of illustration and it will be understood by those of ordinary skill in the art that various modifications and equivalent other embodiments can be made from the inventive concept. Accordingly, the true technical scope of the inventive concept is defined by the technical spirit of the appended claims.

What is claimed is:

1. An organic light-emitting display apparatus comprising:
   a substrate;
   a semiconductor layer disposed on the substrate;
   a gate electrode disposed on the semiconductor layer;
   an interlayer insulating film disposed on the substrate to cover the gate electrode;
   a source electrode and a drain electrode disposed on the interlayer insulating film;
   a color filter disposed on the interlayer insulating film;
   an overcoat layer disposed on the interlayer insulating film to cover the color filter;
   a pixel electrode comprising a first layer and a second layer, the first layer comprising titanium or a titanium alloy and directly contacting the overcoat layer, and the second layer comprising a transparent conductive oxide and directly disposed on the first layer; and
   a pixel-defining film disposed on the pixel electrode,
   wherein:
   the pixel-defining film comprises a first opening exposing a lateral side portion of the pixel electrode and a second opening exposing a top surface of the pixel electrode.

2. The organic light-emitting display apparatus of claim 1, wherein the first layer has a thickness that is equal to or less than 300 Å.

3. The organic light-emitting display apparatus of claim 1, wherein the semiconductor layer comprises an oxide.

4. The organic light-emitting display apparatus of claim 1, further comprising an intermediate layer including an organic emission layer, wherein the intermediate layer is directly disposed on the second layer of the pixel electrode.

5. The organic light-emitting display apparatus of claim 4, further comprising a counter electrode on the intermediate layer, wherein the counter electrode is a reflective electrode.

6. The organic light-emitting display apparatus of claim 1, wherein the pixel-defining film comprises an edge portion adjacent to the second opening, the edge portion being in direct contact with lateral side portions of the first and second layers of the pixel electrode.

* * * * *